United States Patent
Tauchi et al.

(10) Patent No.: US 8,530,024 B2
(45) Date of Patent: Sep. 10, 2013

(54) RECORDING LAYER FOR OPTICAL INFORMATION RECORDING MEDIUM, OPTICAL INFORMATION RECORDING MEDIUM, AND SPUTTERING TARGET

(75) Inventors: Yuki Tauchi, Kobe (JP); Yoko Shida, Kobe (JP); Yasuhiro Sone, Miyagi (JP)

(73) Assignees: Kobe Steel, Ltd., Kobe-shi (JP); Sony Corporation, Tokyo (JP)

( * ) Notice: Subject to any disclaimer, the term of this patent is extended or adjusted under 35 U.S.C. 154(b) by 0 days.

(21) Appl. No.: 13/496,079

(22) PCT Filed: Sep. 17, 2010

(86) PCT No.: PCT/JP2010/066259
§ 371 (c)(1),
(2), (4) Date: Mar. 14, 2012

(87) PCT Pub. No.: WO2011/034188
PCT Pub. Date: Mar. 24, 2011

(65) Prior Publication Data
US 2012/0177863 A1 Jul. 12, 2012

(30) Foreign Application Priority Data
Sep. 18, 2009 (JP) .................................. 2009-217351

(51) Int. Cl.
*G11B 7/24* (2006.01)
(52) U.S. Cl.
USPC ...................... 428/64.1; 428/64.4; 430/270.12
(58) Field of Classification Search
USPC .................................... 428/64.4; 430/270.12
See application file for complete search history.

(56) References Cited

U.S. PATENT DOCUMENTS

| | | | |
|---|---|---|---|
| 6,033,752 A | 3/2000 | Suzuki et al. | |
| 2003/0228539 A1 | 12/2003 | Hosoda et al. | |
| 2005/0082162 A1 | 4/2005 | Uno et al. | |
| 2005/0233247 A1 | 10/2005 | Hosoda et al. | |
| 2006/0222810 A1 | 10/2006 | Hayashi et al. | |
| 2007/0030776 A1* | 2/2007 | Kim et al. | 369/47.1 |
| 2009/0046566 A1 | 2/2009 | Fujii et al. | |
| 2010/0178446 A1 | 7/2010 | Fujii et al. | |

FOREIGN PATENT DOCUMENTS

| | | |
|---|---|---|
| JP | 2002 225433 | 8/2002 |
| JP | 2003 326848 | 11/2003 |
| JP | 2003 331461 | 11/2003 |
| JP | 3499724 | 2/2004 |
| JP | 2005 135568 | 5/2005 |
| JP | 2005 238516 | 9/2005 |
| JP | 2006 247897 | 9/2006 |
| JP | 2007 196683 | 8/2007 |
| JP | 4110194 | 7/2008 |
| WO | 03 101750 | 12/2003 |
| WO | 2010 055865 | 5/2010 |

OTHER PUBLICATIONS

U.S. Appl. No. 13/496,661, filed Mar. 16, 2012, Tauchi, et al.
International Search Report Issued Dec. 21, 2010 in PCT/JP10/66259 Filed Sep. 17, 2010.
Office Action issued in Japanese Application No. 2009-217351 issued May 21, 2013 (with English Translation).

* cited by examiner

*Primary Examiner* — Elizabeth Mulvaney
(74) *Attorney, Agent, or Firm* — Oblon, Spivak, McClelland, Maier & Neustadt, L.L.P.

(57) ABSTRACT

A recording layer excellent in recording property, an optical information recording medium including the recording layer, and a sputtering target for producing the recording layer. The recording layer on which recording is performed through irradiation with a laser light, contains: a Pd oxide; a Ag oxide; and an oxide of a metal X of having an absolute value of the standard free energy of oxide formation per 1 mol of oxygen that is larger than an oxide of Pd and Ag, wherein a ratio of Pd atom to a total (metal X atom+Pd atom+Ag atom) is from 10 to 60 atomic %, a ratio of Ag atom to the total is from 5 to 45 atomic %, and a ratio of Pd atom and the Ag atom to the total is 75 atomic % or less.

15 Claims, No Drawings

RECORDING LAYER FOR OPTICAL INFORMATION RECORDING MEDIUM, OPTICAL INFORMATION RECORDING MEDIUM, AND SPUTTERING TARGET

CROSS REFERENCE TO RELATED APPLICATION(S)

This application is a 35 U.S.C. §371 national stage patent application of international patent application PCT/JP10/066,259, filed Sep. 17, 2010, the text of which is incorporated herein by reference, and claims priority to Japanese patent application JP 2009-217351, filed Sep. 18, 2009, the text of which is also incorporated herein by reference.

TECHNICAL FIELD

The present invention relates to a recording layer for an optical information recording medium, an optical information recording medium, and a sputtering target useful for formation of the recording layer.

BACKGROUND ART

An optical information recording medium (optical disc) typically includes optical discs such as CD, DVD and BD, and is divided broadly into three categories of read-only, write-once and rewritable recording media depending on the recording and reading system for them. Of those, the recording system of the write-once optical disc is mainly and broadly divided into a phase change system where the recording layer undergoes phase change, an interlayer reaction system where multiple recording layers are reacted, a system where the compound constituting the recording layer is decomposed, and a perforation system where the recording layer is processed to form recording marks such as holes or pits locally therethrough.

In the phase change system, there has been proposed a material that utilizes the change in the optical properties thereof through crystallization of the recording layer, for the material of the recording layer. For example, Patent Document 1 proposes a recording layer containing Te—O-M (where M is at least one element selected from metal elements, semimetal elements and semiconductor elements); and Patent Document 2 proposes a recording layer containing Sb and Te.

As the recording layer of the optical information recording medium in the interlayer reaction system, for example, Patent Document 3 proposes a recording layer of which the first recording layer includes an alloy containing In—O—(Ni, Mn, Mo) and the second recording layer includes an alloy containing Se and/or Te elements, O (oxygen), and one element selected from Ti, Pd and Zr. Patent Document 4 proposes laminating a first recording layer of a metal mainly including In and a second recording layer of a metal or a nonmetal except oxide containing at least one element belonging to the Group 5B or the Group 6B, and recording thereon through reaction or alloying by heating.

As the recording layer for the system where the compound constituting the recording layer is decomposed, for example, Patent Document 5 proposes a recording layer including a nitride as a main ingredient thereof, and a material and an organic dye material for recording through decomposition by heating of the nitride have been investigated.

As the recording layer for the perforation system, the layer including a low-melting point metal material has been investigated. For example, Patent Document 6 proposes the layer including an alloy prepared by adding an element of the Group 3B, the Group 4B or the Group 5B to an Sn alloy. Patent Document 7 proposes a recording layer including an Sn-base alloy that contains Ni and/or Co in a range of from 1 to 50 atomic %. Further, Patent Document 8 shows a recording layer including an In alloy containing Co in an amount of from 20 to 65 atomic %, or an In alloy additionally containing at least one element selected from Sn, Bi, Ge and Si in an amount of 19 atomic % or less.

Further, Patent Document 9 shows a recording layer that consists substantially of Pd, Ag and O, in which the ratio of the number of these atoms Pd, Ag and O is defined.

PRIOR ART DOCUMENTS

Patent Documents

Patent Document 1: JP-A 2005-135568
Patent Document 2: JP-A 2003-331461
Patent Document 3: JP-A 2003-326848
Patent Document 4: Japanese Patent No. 3499724
Patent Document 5: WO2003/101750
Patent Document 6: JP-A 2002-225433
Patent Document 7: JP-A 2007-196683
Patent Document 8: Japanese Patent No. 4110194
Patent Document 9: JP-A 2005-238516

SUMMARY OF THE INVENTION

Problems that the Invention is to Solve

The necessary properties that are required for optical information recording media are mainly that they have a reflectivity enough for reading, that they accept recording thereon with a practicable recording layer power, that the recording signal has a signal amplitude enough for reading (the signal has a high degree of modulation), and the like.

However, the recording materials disclosed as the related art technology could hardly satisfy these necessary properties by the recording materials alone, and in the phase change system, since the reflectivity of the recording layer alone is low, a reflective film for increasing the reflectivity as the optical disc state is necessary, and in addition, for increasing the degree of modulation, a dielectric layer of $ZnS$—$SiO_2$ or the like must be arranged above and below the recording layer, or that is, the number of the layers constituting the optical disc increases. In addition, also in the interlayer reaction system, multiple recording layers are needed, and therefore the number of the layers constituting the optical disc increases. Accordingly, there is a problem in that the number of the film layers increases and the productivity lowers. In contrast to this, in the perforation system, the reflectivity of the recording layer itself is high and the layer can secure a large degree of modulation, and therefore the number of the layers constituting the optical disc can be reduced; however, for attaining a higher recording sensitivity, further investigations are needed. It would be difficult to stabilize and increase more the recording properties when oxides of Pd and Ag are merely formed like in Patent Document 9.

The invention has been made in consideration of the situation as above, and an object thereof is to provide a recording layer for an optical information recording medium which satisfies the above-mentioned necessary properties with reducing the number of the layers of an optical disc and which can increase the productivity of an optical information recording medium; to provide an optical information recording medium including the recording layer, and to provide a sputtering target useful for formation of the recording layer.

Means for Solving the Problems

The invention encompasses the following embodiments.

(1) A recording layer for an optical information recording medium on which recording is performed through irradiation with a laser light, the recording layer comprising:

an oxide of a metal X of which an absolute value of the standard free energy of oxide formation per 1 mol of oxygen is larger than those of Pd and Ag; a Pd oxide; and an Ag oxide, wherein a ratio of the Pd atom contained in the recording layer to a total of the metal X atom, the Pd atom and the Ag atom which are contained in the recording layer is from 10 to 60 atomic %, a ratio of the Ag atom to the total of the metal X atom, the Pd atom and the Ag atom is from 5 to 45 atomic %, and a ratio of a total of the Pd atom and the Ag atom to the total of the metal X atom, the Pd atom and the Ag atom is 75 atomic % or less.

(2) The recording layer for an optical information recording medium according to (1), wherein the metal X is at least one selected from the group consisting of In, Sn, Zn, Bi, Ge, Co, W, Cu and Al.

(3) The recording layer for an optical information recording medium according to (2), wherein the metal X is In.

(4) The recording layer for an optical information recording medium according to any one of (1) to (3), wherein a bubble is formed in a part which is irradiated with the laser light to undergo volume change therein, thereby performing recording.

(5) An optical information recording medium comprising the recording layer according to any one of (1) to (4).

(6) The optical information recording medium according to (5), further comprising a dielectric layer formed adjacent to the recording layer.

(7) A sputtering target for formation of the recording layer for an optical information recording medium as described in any one of (1) to (4), wherein a ratio of a Pd atom contained in the sputtering target to a total of a metal X atom, the Pd atom and an Ag atom which are contained in the sputtering target is from 10 to 60 atomic %, a ratio of the Ag atom to the total of the metal X atom, the Pd atom and the Ag atom is from 5 to 45 atomic %, and a ratio of a total of the Pd atom and the Ag atom to the total of the metal X atom, the Pd atom and the Ag atom is 75 atomic % or less.

(8) The sputtering target according to (7), wherein the metal X is at least one selected from the group consisting of In, Sn, Zn, Bi, Ge, Co, W, Cu and Al.

(9) The sputtering target according to (8), wherein the metal X is In.

Advantage of the Invention

The invention can provide a recording layer for an optical information recording medium (especially a recording layer for a write-once optical information recording medium) capable of attaining a high degree of modulation with a relatively low recording laser power on a practicable level (hereinafter the properties may be referred to as "excellent in recording sensitivity"), and an optical information recording medium (especially a write-once optical information recording medium) including the recording layer. Also the invention can provide a sputtering target useful for formation of the recording layer.

EMBODIMENTS FOR CARRYING OUT THE INVENTION

The present inventors have made assiduous studies for the purpose of realizing a recording layer for an optical information recording medium more excellent in recording sensitivity than already-existing recording layers. As a result, the inventors have found that, when a recording layer containing an oxide of a metal (referred to as a metal X, hereinbelow) of which the absolute value of the standard free energy of oxide formation per 1 mol of oxygen is larger than those of Pd and Ag, a Pd oxide and an Ag oxide is irradiated with laser, then the Pd oxide and the Ag oxide contained in the oxide of metal X are heated by laser irradiation, followed by decomposing to release oxygen thereby stably changing the composition of the recording layer, or that is, concretely when bubbles are formed in a part which is irradiated with the laser, thereby making irreversible recording therein, then the recording sensitivity can be significantly increased than before.

In the recording system by the recording layer, the structure of the recording layer before laser irradiation is amorphous, and even after laser irradiation, the structure is still amorphous; and in this point, the system differs from the phase change system that utilizes change of an amorphous state into crystal through laser irradiation.

The reason why the recording layer of the invention is excellent in recording sensitivity may be considered as follow: the transmittance of the part where bubbles have been formed through laser irradiation may increase (that is, the reflectivity thereof may lower) as compared with that of the part where no bubble have been formed, and therefore the degree of modulation in the part could be thereby increased.

For sufficiently expressing the above-mentioned effect, the following must be satisfied:

relative to the total of the metal X atom, the Pd atom and the Ag atom contained in the recording layer, the ratio of the Pd atom is from 10 to 60 atomic %,
the ratio of the Ag atom is from 5 to 45 atomic %, and
the total of the Pd atom and the Ag atom is 75 atomic % or less.

When the ratio of the Pd atoms is less than 10 atomic %, then the Pd oxide to be decomposed during the laser irradiation may be small so that the amount of oxygen to be released could not be sufficient and the bubbles to be formed would be insufficient and the effect of increasing the recording sensitivity may be low. In addition, the Ag oxide alone is insufficient for morphology change through oxygen release, and the Pd oxide is necessary to some extent. From these viewpoints, in the invention, the ratio of the Pd atoms is 10 atomic % or more. The ratio of the Pd atoms is preferably 15 atomic % or more.

Further in the invention, an Ag oxide is contained in the recording layer along with the Pd oxide therein, whereby the effect of the Pd oxide to enhance the recording sensitivity can be fully increased through oxygen release by reduction of the Ag oxide. For exhibiting the effect, the ratio of the Ag atoms is 5 atomic % or more. The ratio of the Ag atoms is preferably 8 atomic % or more.

On the other hand, by incorporating the oxide of metal X into the recording layer along with the Pd oxide and the Ag oxide therein, it is possible to optimize the morphology change of the recorded part through laser irradiation, as described below. In that manner, in the invention, the presence of the oxide of metal X along with the Pd oxide and the Ag oxide is important, and therefore the upper limit of the Pd atoms is 60 atomic % (the upper limit is preferably 50 atomic %, more preferably 45 atomic %), the upper limit of the Ag atoms is 45 atomic % (the upper limit is preferably 40 atomic %), and the upper limit of the total of the Pd atoms and the Ag atoms is 75 atomic % (that is, the lower limit of the ratio of the metal X atoms relative to the total of the metal X atoms, the Pd atoms and the Ag atoms is 25 atomic %). The upper limit of the total of the Pd atoms and the Ag atoms is preferably 60 atomic %.

In the case where the Pd oxide includes especially Pd monoxide and Pd dioxide, then the recording sensitivity can be more sufficiently increased, and thus the case is preferable. The reason would be because Pd dioxide more unstable than Pd monoxide could be more readily decomposed through laser irradiation to release oxygen, and since Pd dioxide is made to exist in Pd monoxide that is more stable than Pd dioxide, the spontaneous decomposition of the Pd dioxide could be prevented and the a stable recording layer could be obtained.

For increasing the oxygen release amount through decomposition of the Pd dioxide to thereby attain a sufficient reflectivity change by recording, the ratio of the Pd dioxide to the total of the Pd monoxide and the Pd dioxide is preferably 3 mol % or more, and is more preferably 5 mol % or more.

On the other hand, when the amount of the Pd dioxide is too excessive compared to that of the Pd monoxide, then the Pd dioxide could not exist stably whereby the formation of the recording layer is difficult. Consequently, the ratio of the Pd dioxide to the total of the Pd monoxide and the Pd dioxide is preferably 70 mol % or less, more preferably 60 mol % or less.

As described above, the recording layer of the invention must contain, along with the above-mentioned Pd oxide and Ag oxide, an oxide of a metal (metal X) of which the absolute value of the standard free energy of oxide formation per 1 mol of oxygen is larger than that of Pd and Ag. In that manner, a metal oxide (oxide of X metal) more stable than Pd oxide and Ag oxide is contained therein along with Pd oxide and Ag oxide, and therefore, the morphology change through oxygen release during the decomposition of the Pd oxide and Ag oxide can be clarified and enlarged, whereby a sufficient reflectivity change by recording, that is, high degree of modulation, can be realized.

As the metal (metal X) of which the absolute value of the standard free energy of oxide formation per 1 mol of oxygen is larger than that of Pd and Ag, examples thereof include In, Sn, Zn, Bi, Ge, Co, W, Cu and Al (the standard free energy of oxide formation per 1 mol of oxygen at room temperature of Pd is about −150 kJ/mol and that of Ag is −40 kJ/mol, and those of In, Sn, Zn, Bi, Ge, Co, W, Cu and Al are −500, −520, −640, −330, −420, −420, −500, −270 and −1050 kJ/mol, respectively). Of those, In and Bi are preferable; or that is, In oxide and Bi oxide are preferred as the oxide of metal X to be contained along with the Pd oxide and the Ag oxide.

The recording layer of the invention may contain a metal Pd, in addition to the oxide of metal X, the Pd oxide and the Ag oxide therein.

In addition, inevitable impurities that may inevitably mix therein during the formation may be contained therein. However, the ingredient composition of the recording layer of the invention does not define even the minor ingredients inevitably mixing therein, as long as the properties of the invention are not impaired, the mix of a small amount of the inevitable impurities could be allowed In the recording layer of the invention, for the purpose of increasing the absorptance and controlling the reflectivity thereof, the layer may contain Sn, Al, Bi, Cu, Nb, Ti, Si or Ta, for example as an oxide thereof, within a range of 30 atomic % or less in total.

The thickness of the recording layer may vary depending on the structure of the optical information recording medium where any other layer such as a dielectric layer or optical regulation layer may be inserted above/below the recording layer, but preferably, the thickness of the recording layer is from 5 to 100 nm in the case where the recording layer is used as a single layer (in the case where the dielectric layer, optical regulation layer or the like is not provided). When the thickness of the recording layer is smaller than 5 nm, a sufficient reflectivity change by recording may hardly be attained. More preferably, the thickness is 10 nm or more, even more preferably 20 nm or more, still more preferably 25 nm or more. On the other hand, when the thickness of the recording layer is more than 100 nm, then the film formation may take a lot of time and the productivity may lower and, in addition, the laser power necessary for recording may increase, and thus, such a case is not preferable. More preferably, the thickness of the recording layer is 70 nm or less, even more preferably 60 nm or less.

The recording layer is preferably formed by the sputtering method. Regarding the sputtering condition, the Ar flow rate may be from 10 to 100 sccm and the oxygen flow rate may be from 10 to 100 sccm. For the other condition in the sputtering method, any ordinary sputtering condition is employable. For example, the gas pressure may be controlled to fall within a range of from 0.1 to 1.0 Pa, the sputtering power may be, for example, within a range of from 0.5 to 20 W/cm$^2$.

As the sputtering target (hereinafter this may be simply referred to as "target") for use in forming the recording layer of the invention according to the sputtering method, the target which satisfies the following can be used.

Relative to the total of the metal X atoms (preferably at least one selected from the group consisting of In, Sn, Zn, Bi, Ge, Co, W, Cu and Al, more preferably In), the Pd atoms and the Ag atoms contained in the sputtering target, the ratio of the Pd atoms is from 10 to 60 atomic %, the ratio of the Ag atoms is from 5 to 45 atomic %, and the total of the Pd atoms and the Ag atoms is 75 atomic % or less.

Concrete embodiments of the target include a target which contains the metal X as the oxide thereof (that is, an oxide of metal X) and contains a metal Pd and/or a Pd oxide as the Pd atom and a metal Ag and/or an Ag oxide as the metal Ag.

The other embodiments include a target containing the metal X atom, the Pd atom and the Ag atom all as metals, that is, an alloy containing these elements.

In the case where the above-mentioned elements (metal X atom, Pd atom, Ag atom) exist as oxides thereof in the target, the ratio of the elements mentioned above indicate the value converted to the atoms except the oxygen atoms in the oxides.

As the above target, a target produced by mixing a powder of an oxide of the metal X, a powder of the metal Pd and a powder of the metal Ag and sintering the mixture is especially preferable, from the viewpoint of the productivity and of the in-plane uniformity of the composition of the thin film and the thickness controllability thereof. The target may contain inevitable impurities that may inevitably mix therein during the formation. However, the ingredient composition of the sputtering target of the invention does not define even the minor ingredients inevitably mixing therein, as long as the properties of the invention are not impaired, the mix of a small amount of the inevitable impurities could be allowed For forming recording layer, sputtering may be attained with the above-mentioned target, and in addition, multicomponent sputtering may also be attained by, for example, using a metal X target, a metal Pd target (pure metal Pd target) and a metal Ag target (pure metal Ag target) and simultaneously discharging them for multicomponent sputtering.

The optical information recording medium of the invention has the recording layer having the above-mentioned excellent properties, and for securing excellent durability to maintain the above-mentioned excellent properties even in high-temperature high-humidity environments, a dielectric layer is preferably formed adjacent to the recording layer in the medium. In high-temperature high-humidity environments, the Pd oxide and the Ag oxide in the part which is not irradiated with laser (that is, not processed for recording thereon) may be gradually reduced to release oxygen and, as a result, the optical properties may change and the reflectivity thereof may lower, and this would be a reason for durability reduction. However, when a dielectric layer is formed, then it could prevent any unnecessary decomposition of the Pd oxide (especially Pd dioxide) and the Ag oxide and the oxides could be kept stable.

As the embodiment where "a dielectric layer is formed adjacent to the recording layer", examples thereof include a case where the dielectric layer is formed between the substrate and the recording layer and adjacent to the recording layer and/or a case where the dielectric layer is formed between the recording layer and the light-transmissive layer to be mentioned hereinunder and adjacent to the recording layer.

The dielectric layer acts as an oxygen barrier layer to thereby enhance the durability. By preventing oxygen generated through the decomposition of Pd oxide or Ag oxide from scuttling away, the reflectivity change (especially the reflectivity reduction) would be prevented, and thus, the necessary reflectivity of the recording layer could be secured.

Further, the recording properties can be enhanced by forming the dielectric layer. This would be because, the thermal diffusion of the incident laser could be optimally controlled by the dielectric layer and therefore the bubbles in the recording part could be prevented from growing too large and the decomposition of Pd oxide is prevented from being too much promoted so that the bubbles are crushed, whereby the form of the bubble could be optimized.

As the material of the dielectric layer, examples thereof include oxides, nitrides, sulfides, carbides, fluorides or their mixtures. As the oxides, examples thereof include oxides of at least one element selected from the group consisting of In, Zn, Sn, Al, Si, Ge, Ti, Ta, Nb, Hf, Zr, Cr, Bi and Mg (preferably oxide of at least one element selected from the group consisting of In, Sn, Si, Zr and Zn). As the nitrides, examples thereof include nitrides of at least one element selected from the group consisting of In, Sn, Ge, Cr, Si, Al, Nb, Mo, Ti, and Zn (preferably nitrides of Si and/or Ge); as the sulfides, examples thereof include Zn sulfide. As the carbides, examples thereof include carbides of at least one element selected from the group consisting of In, Sn, Ge, Cr, Si, Al, Ti, Zr, Ta and W (preferably carbides of at least one element selected from the group consisting of Si, Ti and W); and as the fluorides, examples thereof include fluorides of at least one element selected from the group consisting of Si, Al, Mg, Ca and La. As their mixtures, examples thereof include $ZnS$—$SiO_2$. Of those, the above-mentioned compounds (oxides and the like) containing at least any one of In, Zn, Sn, Al, Si, Ti and Mg or their mixtures are preferable; and the above-mentioned compounds containing at least any one of In, Zn, Sn and Al or their mixtures are more preferable.

The thickness of the dielectric layer is preferably from 1 to 40 nm. This is because, when the thickness thereof is less than 1 nm, the dielectric layer would not sufficiently exhibit the effect thereof (especially the effect thereof as oxygen barrier). More preferably, the thickness is 3 nm or more. On the other hand, when the thickness of the dielectric layer is too large, it is unfavorable since the recording layer would hardly change by the laser irradiation whereby the recording properties thereof would be lowered. Accordingly, the thickness of the dielectric layer is preferably 40 nm or less, more preferably 35 nm or less.

The invention does not restrict the method for forming the dielectric layer; however, the dielectric layer is preferably formed by the sputtering method like the recording layer.

When forming the dielectric layer by the sputtering method, the sputtering condition may be as follows. The Ar flow rate may be within a range of from 10 to 100 sccm; in the case where a metal target mentioned below is used, the oxygen flow rate when forming the oxide layer may be within a range of from 5 to 60 sccm, and the nitrogen flow rate when forming the nitride layer may be within a range of from 5 to 80 sccm. The gas pressure may be within a range of from 0.1 to 1.0 Pa; and the sputtering power may be, for example, within a range of from 0.5 to 50 $W/cm^2$.

The sputtering target to be used when forming the dielectric layer includes targets of the above-mentioned compounds (oxides, nitrides, sulfides, carbides, fluorides), as well as other metal targets containing any element other than oxygen, nitrogen, sulfur, carbon and fluorine in the above-mentioned compounds (pure metal or alloy targets).

The optical information recording medium of the invention is characterized by having the above-mentioned recording layer, and preferably additionally having a dielectric layer. Except the recording layer and the dielectric layer, any configuration known in the field of optical information recording media is employable.

Regarding the configuration of the information recording medium (optical disc), examples thereof include a laminate structure in which a recording layer is laminated on a substrate having laser guide grooves formed thereon, and a light-transmissive layer further laminated thereon.

As the material of the substrate, examples thereof includes polycarbonate resins, norbornene resins, cyclic olefin copolymers, amorphous polyolefins, etc. For the light-transmissive layer, polycarbonates and UV-curable resins are usable. It is preferred that the material of the light-transmissive layer has a high transmittance to the laser for recording and reading and the light absorptance thereof is small. The thickness of the substrate may be, for example, from 0.5 to 1.2 mm. The thickness of the light-transmissive layer may be, for example, from 0.1 to 1.2 mm.

The recording layer of the invention has a high reflectivity and shows excellent recording properties by itself, but if desired, for the purpose of further increasing the reflectivity of the optical disc, an optical regulation layer may be provided between the substrate and the recording layer. As the material of the optical regulation layer, examples thereof include Ag, Au, Cu, Al, Ni, Cr, Ti and their alloys. The thickness of the optical regulation layer may be generally from about 50 to 150 nm or as a complete reflection layer.

In the above, one-layer type optical disc in which one recording layer and one light-transmissive layer are formed are described, but it is not limited thereto, and also includes two or more layers type optical disc in which two or more recording layers and two or more light-transmissive layers are laminated.

In the case where a plurality of the recording layer are included, a transparent interlayer formed of, for example, a UV-curable resin or the like may be included between one recording layer group that includes a recording layer and, as optionally laminated thereon, an optical regulation layer and a dielectric layer, and another recording layer group.

The invention is characterized by employing the above-mentioned recording layer (preferably, additionally a dielectric layer), and the method for forming the substrate and the light-transmissive layer and further the optical regulation layer, the transparent interlayer and the like except the recording layer and the dielectric layer is not specifically defined. According to any ordinary method, therefore, the optical information recording medium may be produced.

The optical information recording medium includes CD, DVD and BD, and for example, BD-R is mentioned as a concrete example thereof capable of recording and reading data by irradiating the recording layer thereof with a blue laser light having a wavelength of from about 380 nm to 450 nm, preferably about 405 nm.

EXAMPLES

The invention is more specifically described below with reference to Examples, but it should not be construed that the invention is limited to the following Examples. The invention can also be practiced by applying modifications within a range adaptable to the purports described above and described below, and all of them are included in the technical scope of the invention.

(1) Production of Optical Disc:

As a disc substrate, a polycarbonate substrate (thickness, 1.1 mm; diameter, 120 mm; track pitch, 0.32 μm; groove depth, 25 nm) was used. According to a DC magnetron sputtering method, various kinds of recording layers composed of In oxide, Pd oxide and Ag oxide were formed on the substrate. The thickness of the recording layer was 40 nm. The recording layer was formed through multicomponent sputtering in which three targets of a pure In metal target, a pure Pd metal target and a pure Ag metal target (in Nos. 5 and 8 in Table 1, two of those targets) were simultaneously discharged.

The sputtering condition for forming the recording layer was: Ar flow rate of 10 sccm, oxygen flow rate of 10 sccm, gas pressure of 0.4 Pa, DC sputtering power of from 100 to 200 W, and substrate temperature of room temperature.

The ingredient composition of the deposited recording layer [the ratio of the In atoms (atomic %), the ratio of the Pd atoms (atomic %), the ratio of the Ag atoms (atomic %) relative to In atoms+Pd atoms+Ag atoms] was analyzed according to fluorescent X-ray analysis or ICP emission analysis.

In Nos. 1 to 6 and 8 in Table 1, an In oxide layer in a thickness of 10 nm was formed as the dielectric layer according to a DC magnetron sputtering method using an In oxide target. The sputtering condition for forming the dielectric layer was: Ar flow rate of 10 sccm, gas pressure of 0.2 Pa, DC sputtering power of from 100 to 200 W, and substrate temperature of room temperature.

Next, a UV-curable resin ("BRD-864" manufactured by Nippon Kayaku Co., Ltd.) was applied onto the dielectric layer (onto the recording layer in No. 7) according to a spin coating method, followed by irradiating with UV rays to form a light-transmissive layer having a thickness of about 0.1 mm, thereby producing an optical disc.

For forming the recording layer in No. 6 in Table 1, three targets of a pure In metal target, a pure Pd metal target and a pure Cu metal target were used for sputtering to form the recording layer composed of In oxide, Pd oxide and Cu oxide.

(2) Evaluation of Optical Disc:

The produced optical disc was evaluated as follows. Specifically, an optical disc evaluation apparatus ("ODU-1000" manufactured by Pulstec Industry Co., Ltd.) was used, the center wavelength of the recording laser was 405 nm, and a lens having NA (numerical aperture) of 0.85 was used. Using the apparatus, laser was applied onto the track, and from the reflected light intensity in the unrecorded part of the optical disc, the reflectivity mentioned below was determined.

Using the above-mentioned optical disc evaluation apparatus, a random signal from 2T to 8T was recorded with a different recording laser power (recording power) under the condition of a linear velocity of 4.92 m/s and a standard clock of 66 MHz. Using Time Interval Analyzer TA810 manufactured by Yokogawa Electric Corporation, the jitter value (this indicates the fluctuation on the time axis of reading signal during recording and reading with reading laser power of 0.3 mW) was measured, and the recording laser power (recording power) with which the jitter value is the smallest was determined (the jitter smallest value and recording power are shown in Table 1).

The degree of modulation at the recording power with which the jitter value was the smallest (rate of reflectivity change) was determined according to the following formula (1). Those of which the smallest jitter value is less than 7% and the degree of modulation was 0.40 or more were accepted as good.

$$\text{Degree of Modulation(rate of reflectivity change)} = \frac{\text{(reflectivity in unrecorded part} - \text{reflectivity in recorded part)}}{\text{(reflectivity in unrecorded part)}} \quad (1)$$

The results are collectively shown in Table 1.

TABLE 1

| No. | Ingredient composition of recording layer [atomic %] | | | | Pd + Ag [atomic %] | Recording power [mV] | Degree of modulation (ratio) | Smallest jitter value [%] |
|---|---|---|---|---|---|---|---|---|
| | In | Pd | Ag | Others | | | | |
| 1 | 53.5 | 39.6 | 6.9 | — | 46.5 | 4.3 | 0.71 | 5.8 |
| 2 | 45 | 42.2 | 12.8 | — | 55 | 4.1 | 0.68 | 6.2 |
| 3 | 36.3 | 42.2 | 21.5 | — | 63.7 | 3.8 | 0.66 | 5.9 |
| 4 | 33 | 25.9 | 41.1 | — | 67 | 3.7 | 0.64 | 6.0 |
| 5 | 17.8 | 0 | 82.2 | — | 82.2 | 3.0 | 0.30 | immeasurable |
| 6 | 47.2 | 36.8 | 0 | Cu: 16.0 | 36.8 | 5.5 | 0.25 | immeasurable |
| 7 | 49.6 | 27.7 | 22.8 | — | 50.5 | 3.9 | 0.51 | 6.7 |
| 8 | 65.7 | 34.3 | 0 | — | 34.3 | 4.5 | 0.53 | 7 |

From Table 1, it is known that the recording layer (Nos. 1 to 4, 7) that satisfies the ingredient composition defined in the invention has a high degree of modulation and excellent in the recording sensitivity with a practicable recording laser power.

In contrast to these, Nos. 5 and 6 which do not satisfy the ingredient composition defined in the invention have a low degree of modulation and are poor in the recording sensitivity. No. 8 could have a high degree of modulation, but the smallest jitter value thereof is relatively large.

While the invention has been described in detail and with reference to specific embodiments thereof, it will be apparent to one skilled in the art that various changes and modifications can be made therein without departing from the spirit and scope thereof.

This application is based on Japanese Patent Application No. 2009-217351 filed on Sep. 18, 2009, and the entire subject matter of which is incorporated herein by reference.

INDUSTRIAL APPLICABILITY

The invention can provide a recording layer for an optical information recording medium (especially a recording layer for a write-once optical information recording medium) capable of attaining a high degree of modulation with a relatively low recording laser power on a practicable level, and an optical information recording medium (especially a write-once optical information recording medium) including the recording layer. Also the invention can provide a sputtering target useful for formation of the recording layer.

The invention claimed is:

1. A recording layer, comprising:
    an oxide of a metal X, wherein an absolute value of the standard free energy of oxide formation per 1 mol of oxygen is larger than an oxide of Pd and Ag, and the metal X is at least one selected from the group consisting of In, Sn, Zn, Bi, Ge, Co, W, Cu, and Al;
    a Pd oxide; and
    an Ag oxide,
wherein, in the recording layer:
    a ratio of a Pd atom content to a total of a metal X atom content, the Pd atom content, and an Ag atom content is from 10 to 60 atomic %;
    a ratio of the Ag atom content to the total is from 5 to 45 atomic %; and
    a ratio of a total of the Pd atom content and the Ag atom content to the total is 75 atomic % or less.

2. The recording layer of claim 1, further comprising:
    a bubble in a recording part obtained by irradiating the recording part with a laser light to undergo volume change therein, thereby recording.

3. An optical information recording medium, comprising the recording layer of claim 1.

4. The optical information recording medium of claim 3, further comprising a dielectric layer adjacent to the recording layer.

5. A sputtering target, comprising: Pd; Ag; and a metal x, wherein,
    the metal X is at least one selected from the group consisting of In, Sn, Zn, Bi, Ge, Co, W, Cu, and Al; and in the target:
    a ratio of a Pd atom content to a total of a metal X atom content, the Pd atom content, and an Ag atom content is from 10 to 60 atomic %;
    a ratio of the Ag atom content to the total is from 5 to 45 atomic %; and
    a ratio of a total of the Pd atom content and the Ag atom content to the total is 75 atomic % or less.

6. The recording layer of claim 1, which is suitable for an optical information recording medium.

7. The recording layer of claim 1, wherein the metal X is Sn.

8. The recording layer of claim 1, wherein the metal X is Zn.

9. The recording layer of claim 1, wherein the metal X is Bi.

10. The recording layer of claim 1, wherein the metal X is Ge.

11. The recording layer of claim 1, wherein the metal X is Co.

12. The recording layer of claim 1, wherein the metal X is W.

13. The recording layer of claim 1, wherein the metal X is Cu.

14. The recording layer of claim 1, wherein the metal X is Al.

15. A process for producing the recording layer of claim 1, the process comprising:
    sputtering a target comprising: Pd; Ag; and the metal X onto a substrate, to obtain the recording layer.

* * * * *